(12) United States Patent
Tung (10) Patent No.: US 6,442,950 B1
(45) Date of Patent: Sep. 3, 2002

(54) COOLING SYSTEM OF CHAMBER WITH REMOVABLE LINER

(75) Inventor: Ke-Wei Tung, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/862,494

(22) Filed: May 23, 2001

(51) Int. Cl.⁷ .............................. F25D 25/00; F24F 3/16; C23C 16/00
(52) U.S. Cl. ................. 62/62; 62/78; 118/724
(58) Field of Search ................. 62/62, 78; 118/724

(56) References Cited

U.S. PATENT DOCUMENTS

| | | | | |
|---|---|---|---|---|
| 2,437,414 A | * | 3/1948 | Archibald | 62/62 |
| 4,981,102 A | * | 1/1991 | Gautreaux et al. | 118/725 |
| 5,482,559 A | * | 1/1996 | Imai et al. | 118/728 |
| 5,740,845 A | * | 4/1998 | Bonora et al. | 141/292 |
| 5,879,461 A | * | 3/1999 | Adams | 118/724 |
| 6,000,227 A | * | 12/1999 | Kroeker | 62/62 |
| 6,120,660 A | * | 9/2000 | Chu et al. | 204/298.15 |
| 6,125,551 A | * | 10/2000 | Bushong et al. | 34/318 |
| 6,331,212 B1 | * | 12/2001 | Mezey | 118/725 |

* cited by examiner

Primary Examiner—William C. Doerrler (57) ABSTRACT

A cooling system of chamber with a removable liner includes follows gas temperature adjusting assembly, gas supplying assembly, and gas controlling assembly. Gas temperature adjusting assembly is located between removable liner and a wall of said chamber. Gas supplying assembly is connected with gas temperature adjusting assembly and could be used to supply a gas which is required by gas temperature adjusting assembly. Gas controlling assembly is connected with gas supplying assembly and could be used to control both flow rate and flow account of gas, such that temperature could be adjusted right now.

8 Claims, 7 Drawing Sheets

COOLING SYSTEM OF CHAMBER WITH REMOVABLE LINER

BACKGROUND OF THE INVENTION

1. Field of the Invention

This invention relates generally to cooling system of chamber with removable liner, and particularly relates to cooling system which directly cools liner by gas.

2. Description of the Prior Art

Numerous semiconductor fabricating processes are performed in chamber and whole space inside chamber is affected by execution of semiconductor fabricating processes. Thus, although semiconductor fabricating processes focus on wafer(s), which is located on bottom plate of reactor, and fabrication on wafer usually are controlled by top plate, which is opposite to bottom plate, wall of chamber can not totally avoid disadvantages such as pollution and damage, especially chamber is used to execute etching process. Therefore, a direct result is that chamber, at least wall, requires frequent clean, even lifetime of chamber, at least wall, is shortened by unavoidable damages.

Figure 1A:
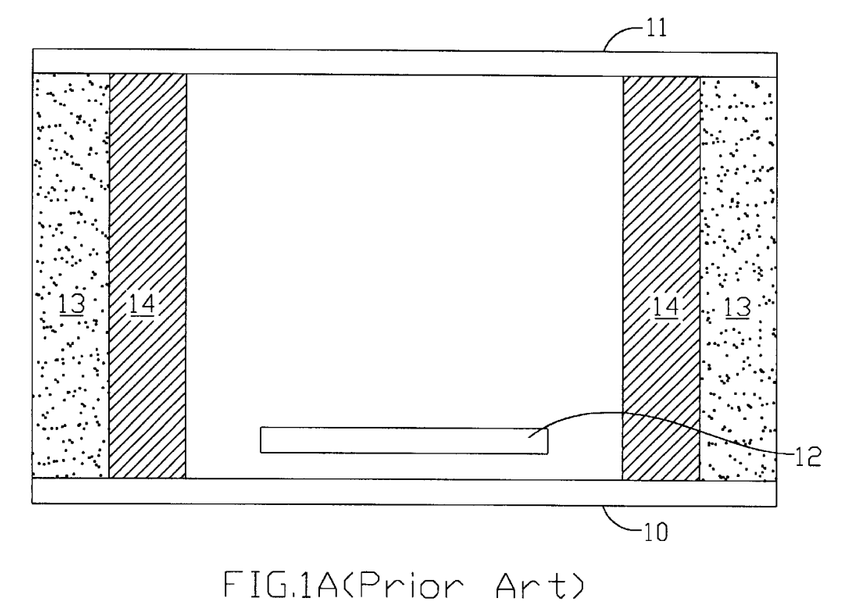
FIG. 1A through FIG. 1D are three cross-sectional illustrations and a top-view illustration in sequence: first figure relates to chamber without liner, second figure chamber with liner, third and fourth figure shows chamber with both liner and chiller.
Figure 1B:
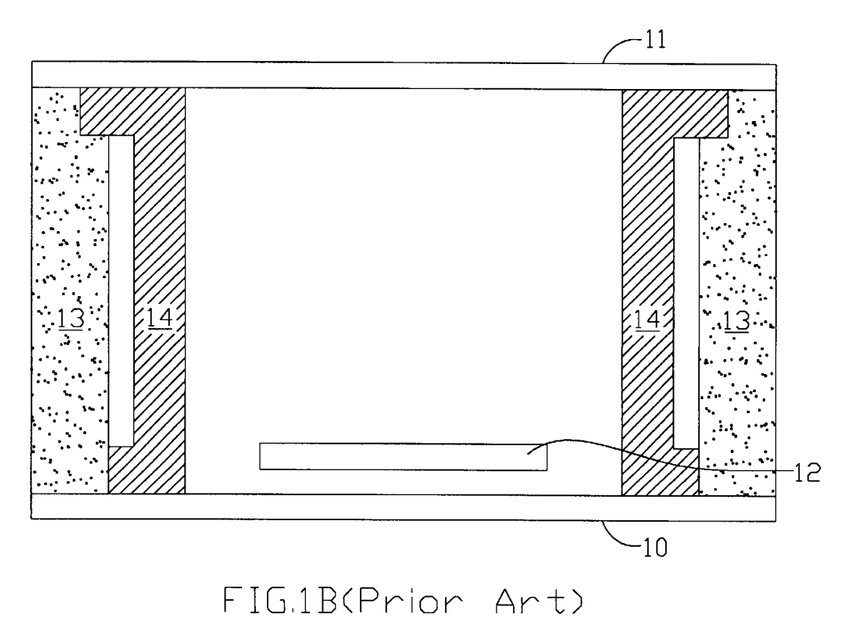

In response to this problem, as the cross-section illustration shown in FIG. 1A, a popular solution is to add removable liner 14 on one face, which facing wafer 12, of wall 13 to let these processes only affect bottom plate 10, top plate 11, and liner 14 but do not induce pollution and damage on wall 13. Because liner 14 is removable, it is possible to clean or substitute used liner 14 and then both lifetime and quality of wall 13 is improved. As usual, owing to liner 14 only is used to protect wall 13, devices for controlling parameters such as temperature and electric filed still are located in wall 13, to let structure of liner 14 is simplified and cost is reduced. Moreover, liner 14 usually is hanged on or locked in wall 13. Obviously, if liner 14 and wall 13 is totally stuck, as FIG. 1A shows, heat only could be propagated by conduction; and if liner and wall is not totally stuck, heat could be propagated by both conduction and radiation.

Figure 1C:
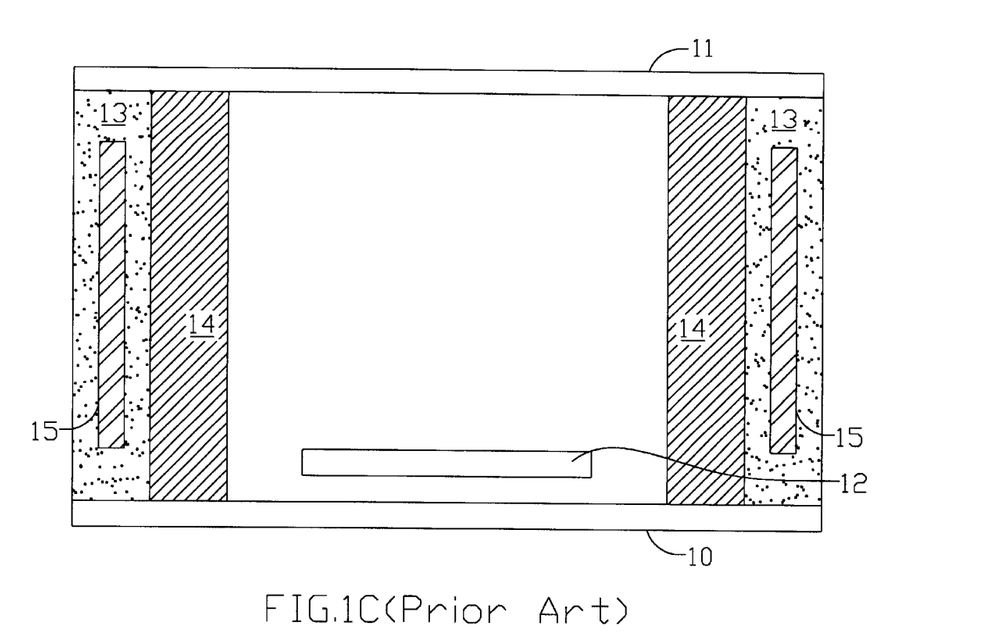

Indisputable, because both liner 14 and wall 13 would interact with any semiconductor fabricating process which is executed in chamber, it is necessary to precisely control temperature of both wall 13 and liner 14. Especially, while chamber could be heated by microwave or coil, how to control, or cool, temperature of wall 13 and liner 14 would be an indispensable part for controlling temperature inside chamber. As the cross-sectional illustration FIG. 1C shows and as top-view illustration FIG. 1D, conventional technologies usually use chill 14 to control temperature, where chiller 14 is located in wall 13 and surround wafer 12. Moreover, chiller 15 could control temperature of liner 14 which is directly affected by semiconductor fabricating process, and chiller 14 usually use liquid to carry heat away.

Figure 1D:
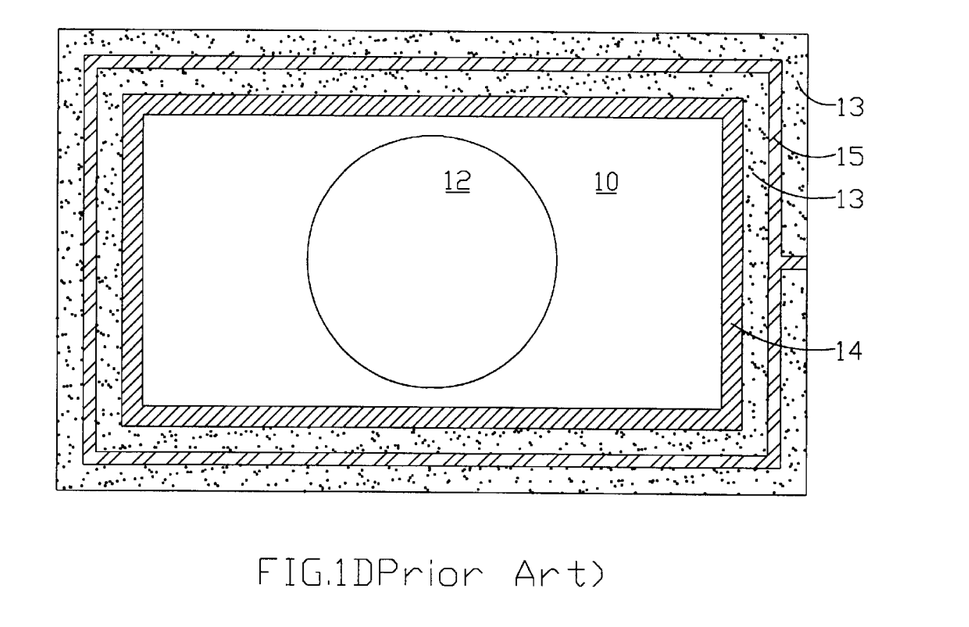

However, following disadvantages almost are unavoidable. First, only conduction and radiation are available between wall 13 and liner 14, but also efficiency of radiation is not good while chamber is in vacuum during execution of semiconductor fabricating processes and efficiency of conduction is limited by both shape and material of connection between liner 14 and wall 13, and then efficiency of heat propagation between liner 14 and wall 13 is not good. Next, because chiller 13 does not directly touch with liner 14 but is located inside wall 13, it is necessary to change temperature of liner 14 by changing temperature of wall 13, and then it is hard to precisely control temperature of liner 14. Further, because temperature variation of liquid which is used by chiller 15 requires a long time to achieve, it is hard to let chiller response to temperature variation in liner 14 in time, and then it is hard to modulate temperature of liner 14 in time.

In short, application of liner really could reduce maintenance cost and prolong lifetime of liner, but conventional technologies are hardly to precisely control temperature of liner. Therefore, how to precisely control temperature of liner becomes an important topic about liner application.

SUMMARY OF THE INVENTION

One main object of this invention is to present a cooling system for directly adjusting temperature of liner.

Another main object of this invention is to present a chamber with function of gas cooling, and then conventional disadvantages induced by liquid cooling could be overcame.

Still one main object of this invention is to present a technology for effectively and elastically controlling temperature of liner of chamber.

One preferred embodiment of this present invention is a cooling system of chamber with a removable liner, at least includes gas temperature adjusting assembly, gas supplying assembly, and gas controlling assembly. Gas temperature adjusting assembly is located between removable liner and a wall of said chamber. Gas supplying assembly is connected with gas temperature adjusting assembly and could be used to supply a gas which is required by gas temperature adjusting assembly. Gas controlling assembly is connected with gas supplying assembly and controls both flow rate and flow account of gas.

Another preferred embodiment is a chamber with gas cooling function, at least includes a bottom plate, a top plate, a wall, a liner, a gas pipeline, and a sealing device. Bottom plate is located under a wafer and top plate is located over this wafer, wall connects bottom plate with top plate and surrounds wafer. Liner is located between wall and wafer, liner touches with wall and is removable, however, liner is not totally stuck to well and a sealed space is located between liner and wall. Gas pipeline is connected with sealed spaced and could provide a gas to sealed space. Sealing device not only is located between liner and wall but also is located around sealed space, sealed space is surrounded by wall, liner, and sealing device but only is conducted with gas pipeline.

BRIEF DESCRIPTION OF THE DRAWINGS

A more complete appreciation and many of the attendant advantages will be readily obtained as the same becomes better understood by reference to the following detailed description when considered in connection with the accompanying drawings.

DESCRIPTION OF THE PREFERRED EMBODIMENT

Applicant of this invention emphasizes that disadvantages of conventional technology are mainly induced by following reason: although liner is added to chamber to protect wall from pollution and damage, cooling system of chamber is not modified. Thus, because chiller is inside wall, cooling system could not directly adjust temperature of liner. Moreover, another main reason is that chiller use liquid to carry heat away, although liquid could carry a large quantity of heat, not only structure of chiller is complicated but also temperature modification of liquid needs a long time which let response time of chiller is long.

Response to previous two reasons, applicant of this invention presents a way to improve or even eliminate previous disadvantages: direct cool liner by gas. Because liner is directly cooled by gas, temperature of liner could be precisely adjusted by adjusting flow rate, flow account, and temperature of gas. Moreover, gas which touches with liner could carry heat away liner by convection and then efficiency of heat propagation could be further enhanced. Besides, because specific heat of gas is smaller than liquid, it is possible to adjust temperature of liner in time. Finally, configuration of gas cooling system is simple ad then configuration of chamber would not be complicated after gas cooling system is added. In fact, even is gas is leaked, gas still could be pumped away and then pollution induced by leaked gas is negligible. Certainly, although this present invention direct cool liner by gas, this present invention still could further enhance cooling function by further using liquid cooling system which is used by conventional technologies.

Figure 2A:
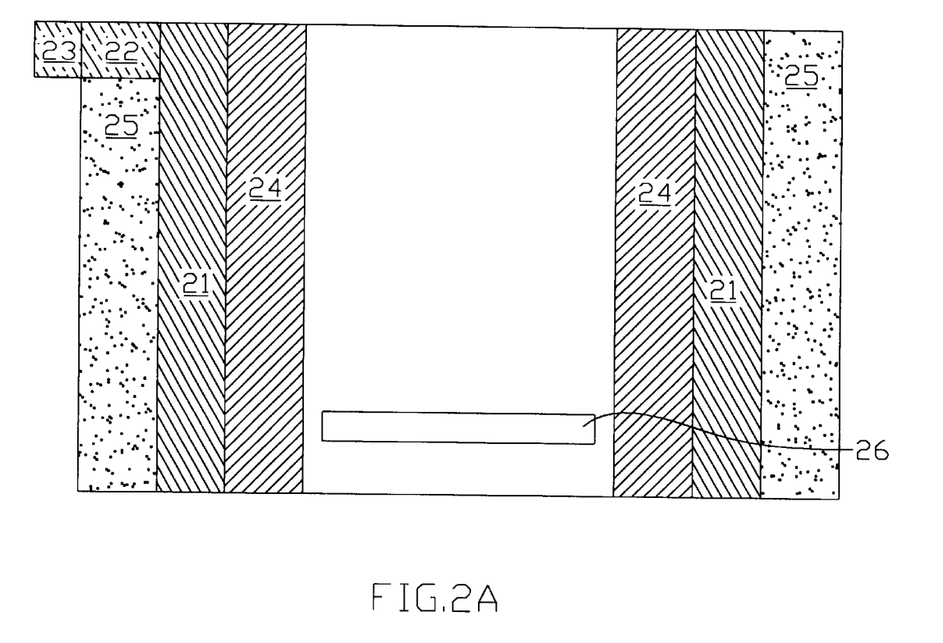
FIG. 2A through FIG. 2D are two cross-sectional illustrations and two top-view illustration about two possible configurations of one preferred embodiment of this present invention.
Figure 2B:
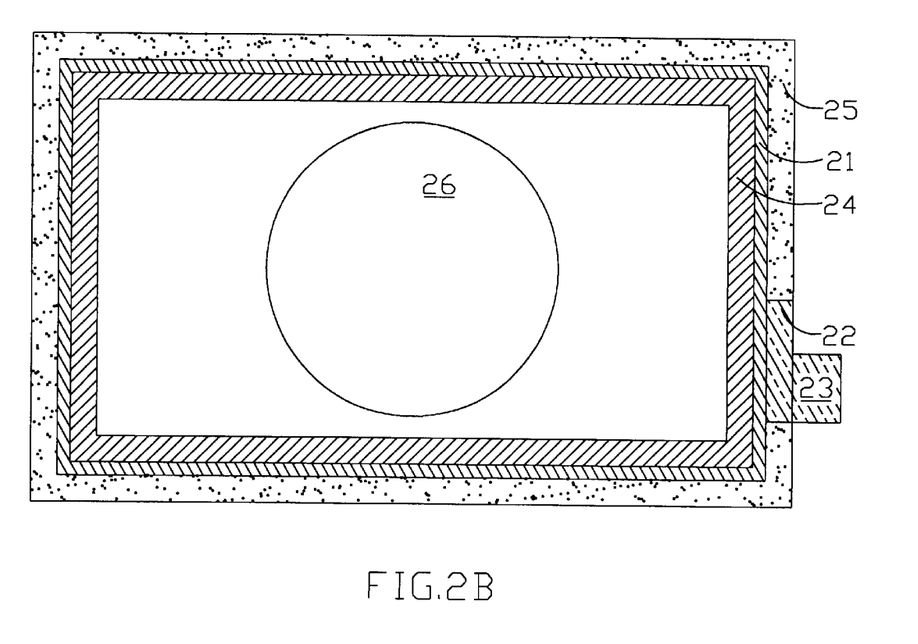

One preferred embodiment of this present invention is a cooling system of chamber with a removable liner, as shown in FIG. 1A and FIG. 2B, this embodiment at least includes gas temperature adjusting assembly 21, gas supplying assembly 22, and gas controlling assembly 23.

Gas temperature adjusting assembly 21 is located between removable liner 24 and wall 25 of chamber. As usual, gas temperature adjusting assembly 21 let gas directly touches with liner 24, and uses O-rings, not shown in FIG. 2A and FIG. 2B, to insulate gas form other part of chamber to ensure any executed semiconductor fabricating process inside chamber is not degraded by gas. However, gas temperature adjusting assembly also could further let gas directly touches wall 23 to let gas temperature adjusting assembly could directly adjust temperature of wall 25.

Gas supplying assembly 22 is connected with gas temperature adjusting assembly 21 and supplies the gas which gas temperature adjusting assembly requires, such as high-pressure air, dry air, nitrogen, or inert gas. Location of gas supplying assembly 22 is not key of this present invention. Gas supplying could be located in wall 25 or in liner 24, but usually is located in wall 25 to simplify structure of liner 24 and reduce cost. Here, all corresponding figures show the case that gas supplying assembly 22 is located in wall 25, and also omit gas source. Reasonably, gas supplying assembly 22 only needs to be connected with gas temperature adjusting assembly 21 to supply gas, has supplying assembly does not need to surround wafer 26.

Gas controlling assembly 23 is connected with gas supplying assembly 22 and controls both flow rate and flow account of gas. As usual, gas controlling assembly 23 is combination of valve and computer, and could be located at any position. Here, all corresponding figures show the case that gas controlling assembly 23 is located on outside surface of wall 25. Certainly, gas controlling assembly also does not need to surround wafer 26.

Figure 2C:
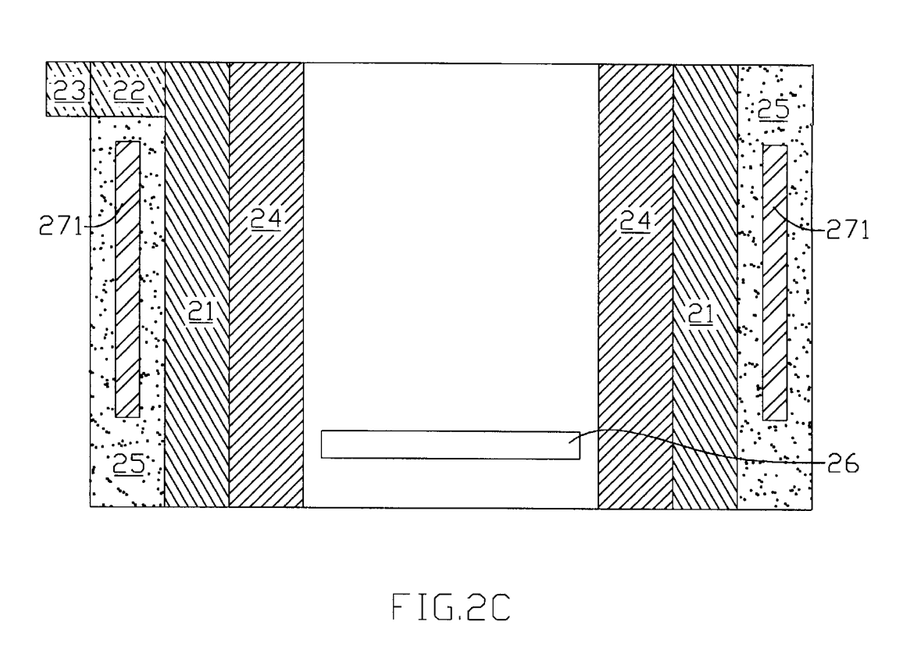
Figure 2D:
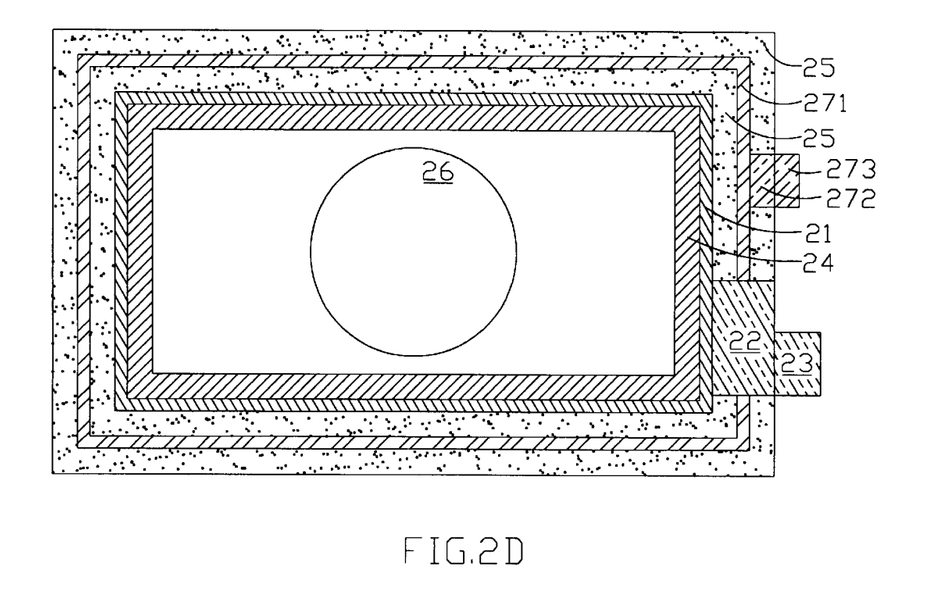

Surely, this embodiment further comprises conventional chiller. In other words, as FIG. 2C and FIG. 2D shows, this embodiment could further comprises liquid temperature adjusting assembly 271 in wall 25 and liquid supplying assembly. Here, liquid temperature adjusting assembly connects with liquid supplying assembly 272, liquid flows form liquid supplying assembly to liquid temperature adjusting assembly and heated liquid flows form liquid temperature adjusting assembly to liquid supplying assembly 272. Moreover, this embodiment further comprises liquid controlling assembly 273 which is connected with liquid supplying assembly 272 and control both flow rate and flow account of liquid.

Figure 3A:
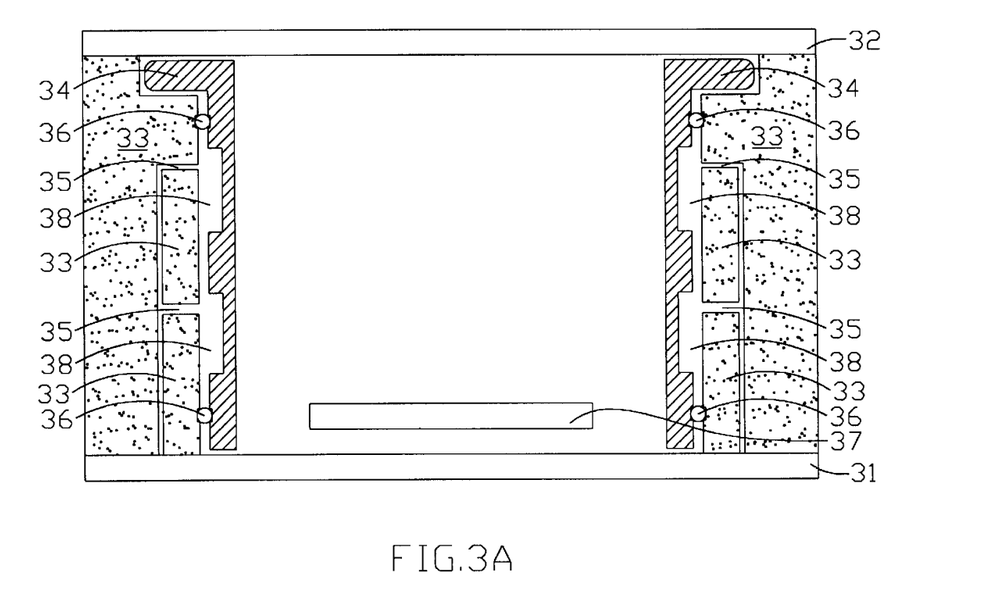
FIG. 3A through FIG. 3E are some cross-sectional illustrations about several possible configurations of another preferred embodiment of this present invention.
Figure 3B:
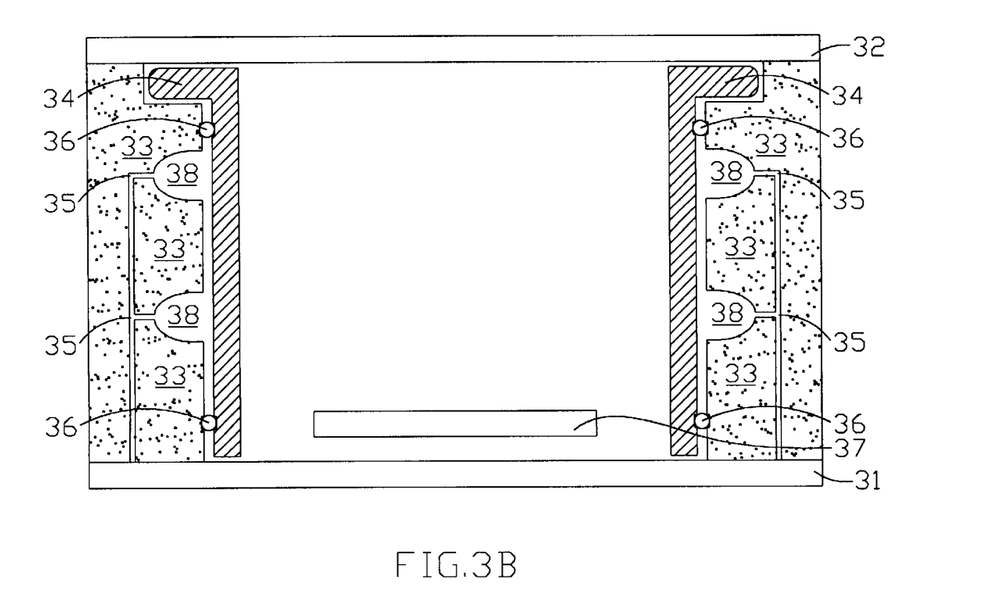
Figure 3C:
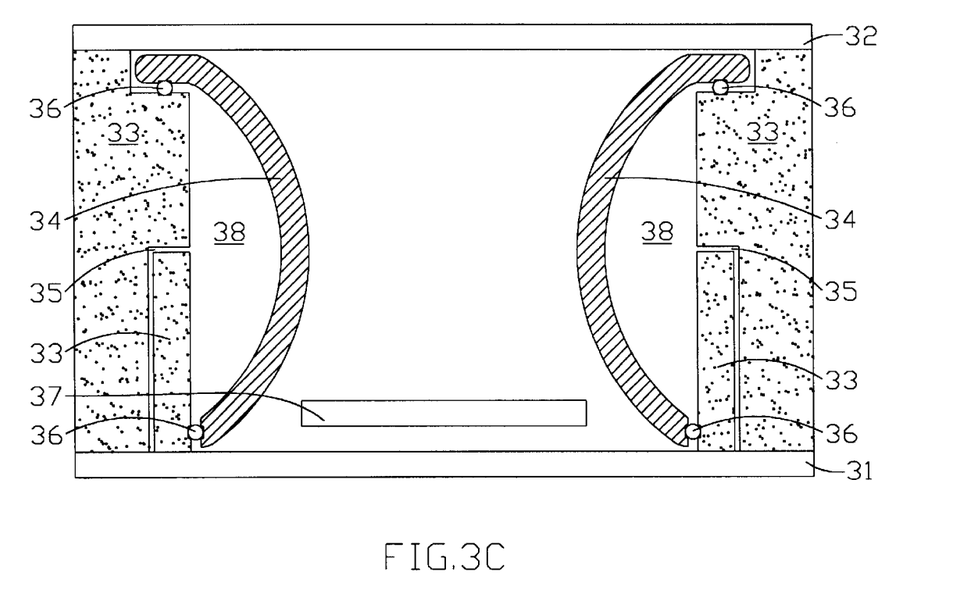
Figure 3D:
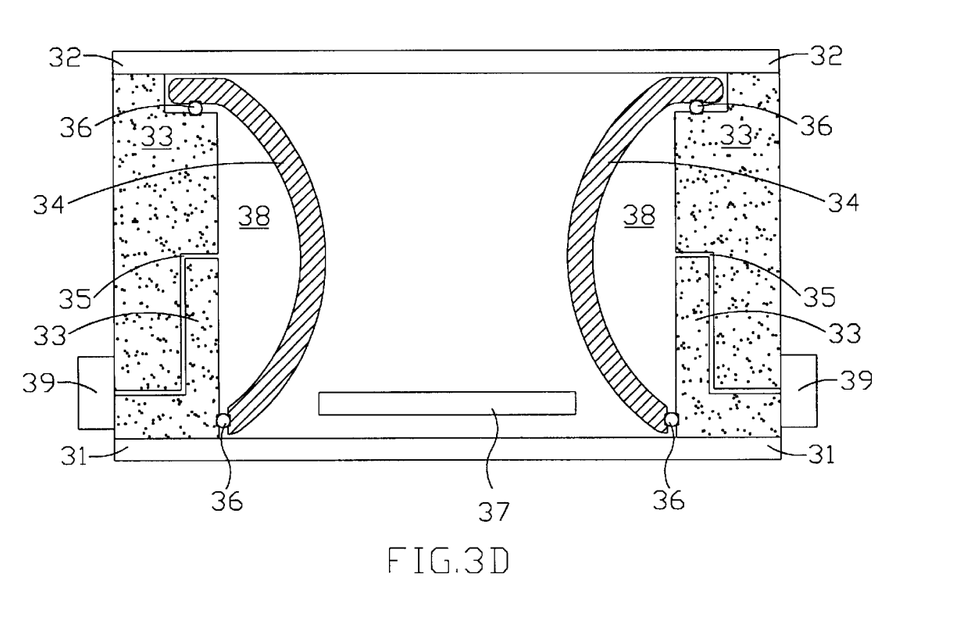

Another preferred embodiment is a chamber with gas cooling function, as FIG. 3a, FIG. 3B, and FIG. 3C show, this embodiment at least includes bottom plate 31, top plate 32, wall 33, liner 34, gas pipeline 35, and sealing device 36.

Bottom plate 31 is located under wafer 37 and top plate 32 is located over wafer 37, and wall 33 connects bottom plate 31 with top plate 32 and surrounds wafer 37. Obviously, bottom plate 31, top plate 32, and wall 33 forms basic structure of chamber. Of course, each of bottom plate 31, top plate 32, and wall 33 has numerous different possible structures, but this embodiment is not limited by these possible structures. Besides, all corresponding figures omit details of chamber such as pipelines for providing reactants and waveguide for providing energy.

Liner 34 is located between wall 33 and wafer 37, liner 37 touches with wall 33 and is removable. However, in this embodiment, liner 34 is not totally stuck to well 33 and sealed space 38 is located between liner 34 and wall 33, where sealed space 38 usually surrounds wafer 37 to provide uniform temperature adjusting ability. Moreover, as FIG. 3A to FIG. 3C shows, sealed space 38 could be provided by at least one trench in a surface of liner 34 which faces to wall 33, sealed space 38 also could be provided by at least one trench in a surface of wall 33 which faces to liner 34, sealed space 38 also could be provided by curved liner 34 and straight wall 33. However, how liner 34 is connected with wall 33 is not key of this invention, whether liner 34 totally covers wall 33 also is not key of this invention.

Gas pipeline 35 is connected with sealed spaced 38 and provides a gas to sealed space 38. Certainly, gas pipeline 38 is connected with a gas source and a pump for pumping gas away sealed space 38, but gas source and pump does not need to be part of this embodiment, and are not shown in any figures. Besides, because liner 34 is removable, gas pipeline 35 usually is located in wall 33, but also could be located in liner 34. As usual, gas pipeline 35 could be divided into input pipeline and out pipeline, gas flows from gas source through input pipeline into sealed spacer 38, and flows through out pipeline away sealed space. Whereby, each of input pipeline and out pipeline could be located in wall 33 or liner 34.

Sealed device 36 not only is located between liner 34 and wall 33 but also is located around sealed space 38, so let sealed space 38 is totally surrounded by wall 33, liner 34, and sealing device 38 but only is conducted with gas pipeline 35. Indisputably, quality of sealed device 36 is the key of whether wafer 37 and executed semiconductor fabricating processes in chamber is degraded by this embodiment. In general, sealed device 36 is made of several O-rings which located between wall 33 and liner 34 and surrounded whole sealed spacer 38.

Furthermore, this embodiment further comprises gas controlling device 39 for controlling both flow rate and flow account of gas. Gas controlling device 39 usually is provided by valve of computer, and could be located on edge of chamber, as FIG. 2D shows, or other places. Surely, there is no inevitable relation between gas controlling device 39 and sealed space 38.

Figure 3E:
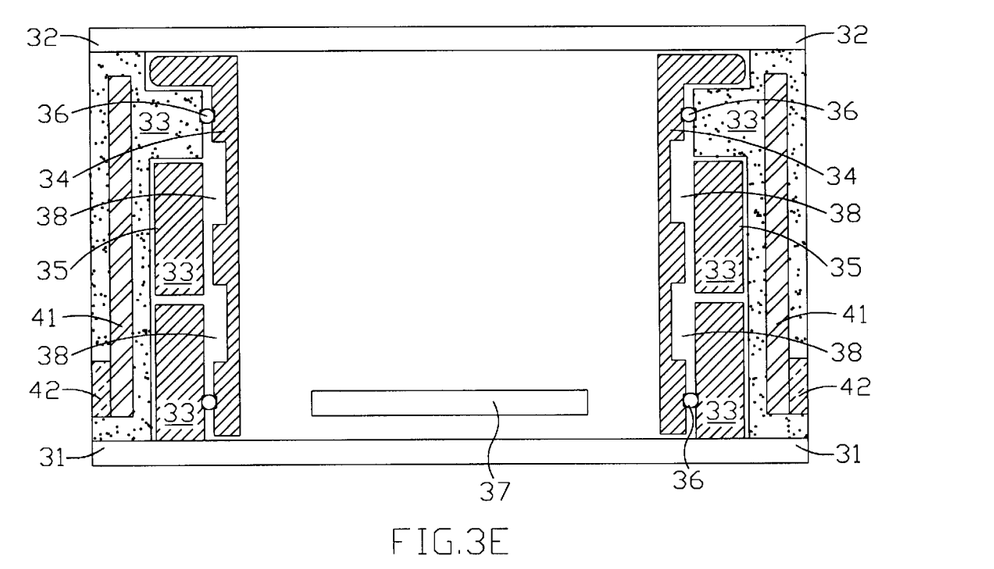

Surely, this embodiment further comprises conventional liquid cooling to enhance temperature control ability of whole reactor. As FIG. 3E shows, this embodiment further comprises liquid pipeline 41, which is located in wall 33 and has a liquid flows inside, and liquid controlling device 42 for controlling both flow rate and flow account of liquid. Liquid pipeline 41 usually surrounds wafer 37 to provide uniform temperature control ability, liquid controlling device 42 usually is combination of valve and is located on edge of chamber or other places.

From the foregoing it will be appreciated that, although specific embodiments of the invention have been described herein for the purpose of illustration, various modifications may be made without deviating from the spirit and scope of the invention. Accordingly, the invention is not limited except as by the appended claims.

What is claimed is:

1. A reaction chamber having a gas temperature-controlling device, comprising:

an inner wall defining a space for accommodating a wafer to be treated;

a removable shield liner substantially surrounding said wafer and covering portion of said inner wall; and a heat-transferring space allocated between and defined by said shield liner and said covered inner wall with a seal for receiving a circulated temperature-controlling gas in touch with said shield liner.

2. The chamber as claimed in claim 1, wherein said circulated temperature-controlling gas is in communication with a gas delivering means that is allocated in said inner wall and supplied with said temperature-controlling gas by a gas controlling assembly.

3. The chamber as claimed in claim 1, wherein said gas delivering means comprises a plurality of trenches formed in the inner wall.

4. A reaction chamber having gaseous cooling function, comprising:

a bottom plate, said bottom plate being located under a wafer;

a top plate, said top plate being located over said wafer;

an inner wall, said inner wall surrounding said wafer and connecting said bottom plate with said top plate;

a shield liner, said shield liner being located between said inner wall and said wafer, said shield liner touching on said inner wall and being removable, and a heat transferring space being located between said shield liner and said inner wall;

a gas pipeline, said pipeline being connected with said heat transferring spaced and providing a temperature-controlling gas to said heat transferring space; and a sealing device, said sealing device not only being located between said shield liner and said inner wall but also being located around said heat transferring space, wherein said heat transferring space is totally surrounded by said inner wall, said shield liner, and said sealing device but only being conducted with said gas pipeline.

5. The chamber as claimed in claim 4, wherein said trenches comprise an input trench and an output trench respectively in communication with said heat transferring space.

6. The chamber as claimed in claim 4, wherein said shield liner is in a form of bulging into said heat transferring space for accommodating said wafer with curve.

7. The chamber as claimed in claim 4, wherein said shield liner comprises a trench forming a part of said heat transferring space for distributing said temperature-controlling gas.

8. The chamber as claimed in claim 4, wherein said inner wall comprises a trench forming a part of said heat-transferring space for distributing said temperature-controlling gas.

* * * * *